(12) United States Patent
Walker et al.

(10) Patent No.: US 7,480,191 B2
(45) Date of Patent: Jan. 20, 2009

(54) HIGH SPEED LOGIC LEVEL SHIFTER

(75) Inventors: James T. Walker, Palo Alto, CA (US); Jimes Lei, Milpitas, CA (US)

(73) Assignee: Supertex, Inc., Sunnyvale, CA (US)

( * ) Notice: Subject to any disclaimer, the term of this patent is extended or adjusted under 35 U.S.C. 154(b) by 66 days.

(21) Appl. No.: 11/530,743

(22) Filed: Sep. 11, 2006

(65) Prior Publication Data

US 2007/0085584 A1    Apr. 19, 2007

Related U.S. Application Data

(60) Provisional application No. 60/719,232, filed on Sep. 21, 2005.

(51) Int. Cl.
*G11C 7/00* (2006.01)

(52) U.S. Cl. .............................. 365/189.11; 365/230.06; 365/226; 327/333; 326/68; 326/81

(58) Field of Classification Search ......... 327/201–203, 327/208–218, 333; 326/63, 68, 81; 365/189.11, 365/154, 149, 226, 185.01, 230.06
See application file for complete search history.

(56) References Cited

U.S. PATENT DOCUMENTS

| | | | | | |
|---|---|---|---|---|---|
| 4,461,964 | A | * | 7/1984 | Shiotari | 327/88 |
| 4,504,747 | A | * | 3/1985 | Smith et al. | 326/70 |
| 6,600,679 | B2 | * | 7/2003 | Tanzawa et al. | 365/189.11 |
| 6,924,683 | B1 | * | 8/2005 | Hayter | 327/218 |
| 7,183,817 | B2 | * | 2/2007 | Sanchez et al. | 327/112 |
| 2006/0238527 | A1 | * | 10/2006 | Walker et al. | 345/204 |

* cited by examiner

*Primary Examiner*—Vibol Tan
(74) *Attorney, Agent, or Firm*—Jeffrey D. Moy; Weiss & Moy, P.C.

(57) ABSTRACT

A circuit for transmitting logic signals across a high voltage barrier has a logic signal buffer with true and complement state differential outputs. A binary flip-flop with set and reset inputs is further provided. A first coupling capacitor is coupled to the true buffer output and to the set input of the binary flip-flop. A second coupling capacitor is coupled to the complement buffer output and to the reset input of the binary flip-flop circuit.

19 Claims, 4 Drawing Sheets

HIGH SPEED LOGIC LEVEL SHIFTER

RELATED APPLICATION

This application is related to U.S. Provisional Application Ser. No. 60/719,232, filed Sep. 21, 2005, in the name of the same inventors listed above, and entitled, "A HIGH SPEED LOGIC LEVEL SHIFTER". The present patent application claims the benefit under 35 U.S.C. §119(e).

FIELD OF THE INVENTION

The invention relates to a high speed logic signal level shifter, and specifically to a circuit for transferring a fast logic signal across a high voltage difference between two circuit sections in an integrated circuit.

BACKGROUND OF THE INVENTION

A high speed DC coupled logic level translator is particularly useful for high speed, high current CMOS drivers. An example of the use of this type of circuit would be in an ultrasound transducer driver high voltage output stage. In this case, an NMOS high voltage transistor with its source grounded would be arranged with its drain connected to the drain of a PMOS high voltage transistor with its source connected to a supply of high voltage. The high voltage could for example be 200 volts DC, whereas the transistors require only 5 to 12 volts of signal between their gate and source terminals for operation. Designate the high voltage supply as VPP, the grounded low voltage supply as VDX, and a floating low voltage supply as VPX. VPX is typically negative relative to VPP, giving a voltage level below VPP for driving the PMOS output transistor, and the other supplies are positive. Low voltage logic circuits could easily provide the gate drive signal for the NMOS transistor, but the PMOS transistor is more difficult to drive since its source is connected to VPP. An auxiliary floating power supply VPX referenced to the high voltage supply can provide power for floating logic circuitry attached to it, but a means must be provided for transmission of the fast logic signals from near ground level to near VPP. The logic swings in both the grounded logic circuitry and the floating logic circuitry would typically be the same, approximately 12 volts in the present example, but this is not a requirement. Therefore both VDX and (VPP-VPX) would be 12 volts for this example.

Problems with the logic signal transfer can be caused by transient or fast changes in the high voltage interfering with the coupling of the logic signals across the voltage barrier. One means which has been successfully used to overcome this problem is to use large pulsed currents in the transfer circuitry. The current pulses are larger than any capacitive displacement currents caused by expected voltage transients, so the circuit operates without error. Power is minimized by use of very short current pulses to transfer information about logic state changes. However, a simpler solution not requiring large pulsed currents in the transfer circuitry would be desirable.

Therefore, a need exists to provide a device and method to overcome the above problem. The device and method will provide a high speed logic signal level shifter. The high speed logic level shifter must be able to transfer a fast logic signal across a high voltage difference between two circuit sections in an integrated circuit. The high speed logic level shifter must be able to transfer a fast logic signal across a high voltage difference between two circuit sections in an integrated circuit without using large pulsed currents in the transfer circuitry.

SUMMARY OF THE INVENTION

In accordance with one embodiment of the present invention, a circuit for transmitting logic signals across a high voltage barrier is disclosed. The circuit has a logic signal buffer with true and complement state differential outputs. A binary flip-flop with set and reset inputs is further provided. A first coupling capacitor is coupled to the true buffer output and to the set input of the binary flip-flop. A second coupling capacitor is coupled to the complement buffer output and to the reset input of the binary flip-flop circuit.

In accordance with another embodiment of the present invention, a circuit for transmitting logic signals across a high voltage barrier is disclosed. The circuit has a logic signal buffer with true and complement state differential outputs. A binary flip-flop with set and reset inputs is provided. A first coupling capacitor is coupled to the true buffer output and to the set input of the binary flip-flop. A second coupling capacitor is coupled to the complement buffer output and to the reset input of the binary flip-flop circuit. An output signal buffer is coupled to the binary flip-flop. The first coupling capacitor and the second coupling capacitor are fabricated with lower plates having an excess substrate capacitance coupled to the logic signal buffer to minimize parasitic capacitance.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

DESCRIPTION OF PREFERRED EMBODIMENT

Figure 1:
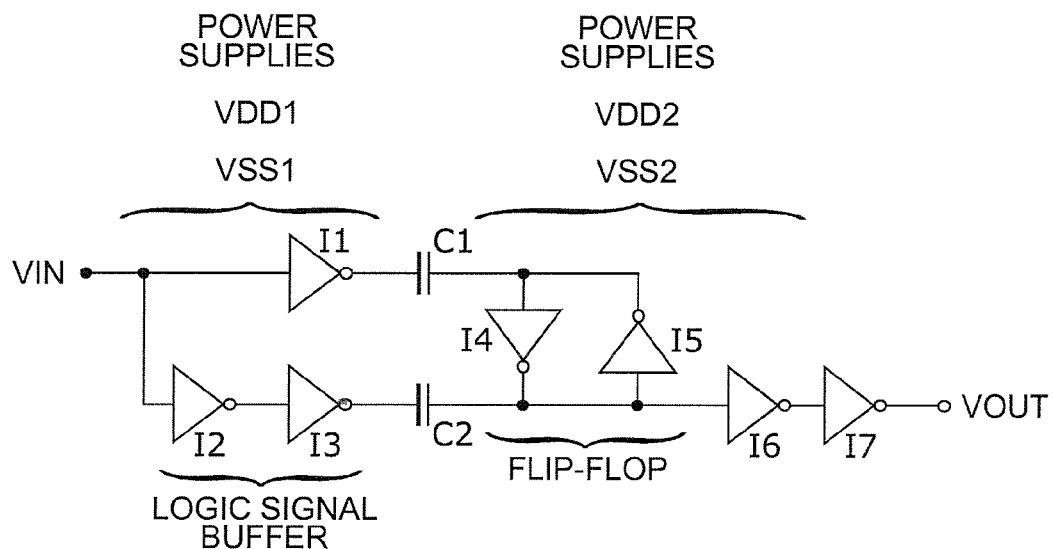
FIG. 1 is a simplified schematic of a circuit for transferring a fast logic signal across a high voltage difference between two circuit sections in an integrated circuit.

This disclosure proposes a means for transferring a fast logic signal across a high voltage difference between two circuit sections in an integrated circuit. The present invention makes use of rapid voltage changes transmitted through small capacitors. The signal changes carried by the capacitors are about 10 times faster than any expected voltage transient on VPP. Furthermore, a differential coupling circuit is used to provide enhanced protection against undesired circuit switching during VPP changes.

Signals being transferred need to include low frequency and DC state information. This problem is handled in the present disclosure by using an auxiliary method to send low frequency information to the floating logic circuitry. Depending on what the system requires, a global reset signal may be sent. The global reset circuit is activated at a time when the level translator output signal is supposed to be in its quiescent state, and acts to force the output into that state. This circuit offers simplicity, as a reset signal may be automatically generated when the system power is first turned on, or supplied by the user or system external to the integrated circuit. Its main disadvantage is that it can only reset the output to one definite state, and if a loss of synchronism occurs at a later time, the circuit is not automatically correcting. The reset signal is transmitted using a relatively slow level translator to send the reset signal from the grounded logic to the floating logic.

The problem of level translator output error may be solved by providing a circuit which detects the conditions that can cause an error, and using it to generate a reset signal. In the present system, resetting the level translator output to its quiescent state is sufficient to guarantee that the circuitry will not be damaged by an undesired operating state. The condition causing problems is an excessive slew rate for the high voltage supply VPP, either due to system operation or due to some type of transient or noise. A slew rate detector for VPP then suffices to detect this condition and automatically supply a reset signal to the floating logic circuit. The level translator will then because of its inherent nature be back in synchronism when the next signal transition occurs.

Automatic correction of the level translator output may be implemented by using a slow DC coupled level translator to send the low frequency information to the high voltage section, and using a logic level comparator to correct the level translator output state. In this case, the input signal level as slowly translated is compared with the high speed level translator output, and changes are made if required to cause synchronism between the overall input and output signals. Since the DC coupled level translator is slow compared to the rest of the logic circuitry, a timer circuit may be used to inhibit correction signals until the DC level translator has had sufficient time for its output to become correct. This method of operation has the advantage that the overall operation of the high speed level translator is continuously monitored, and automatic corrections are made if an error occurs due to noise or a transient operating condition.

Referring to FIG. 1, a simple logic diagram of the level translator 10 is shown. Six logic inverter stages I1-I6 are used together with two capacitors C1 and C2. A logic inverter has the property that if its input is a logic low level, its output will be at a logic high level; if its input is at a logic high level, then its output is at a logic low level. In accordance with one embodiment of the present invention, the logic inverters I1-I6 are CMOS devices, each containing an NMOS and a PMOS transistor as detailed in FIG. 2.

Figure 2:
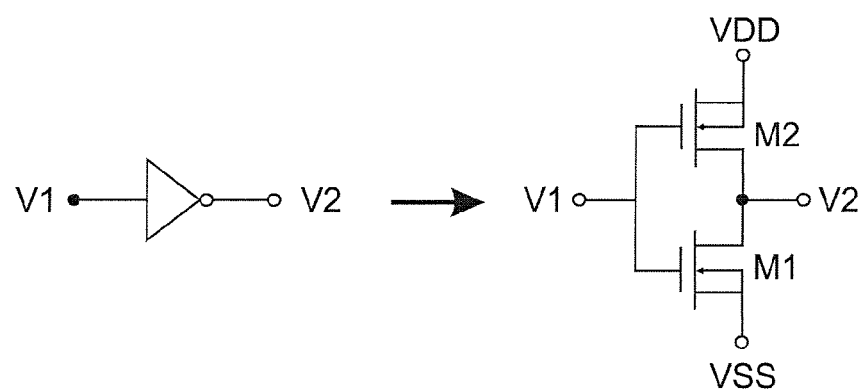
FIG. 2 is a simplified transistor schematic of an inverter used in the present invention.

In FIG. 2, the NMOS transistor MI turns on if the input voltage V1 is a logic high level at approximately VDD, and the PMOS transistor M2 turns on if the input voltage is a logic low level at approximately VSS. For input voltages between these two values, the output voltage will be somewhere between VSS and VDD.

Figure 3:
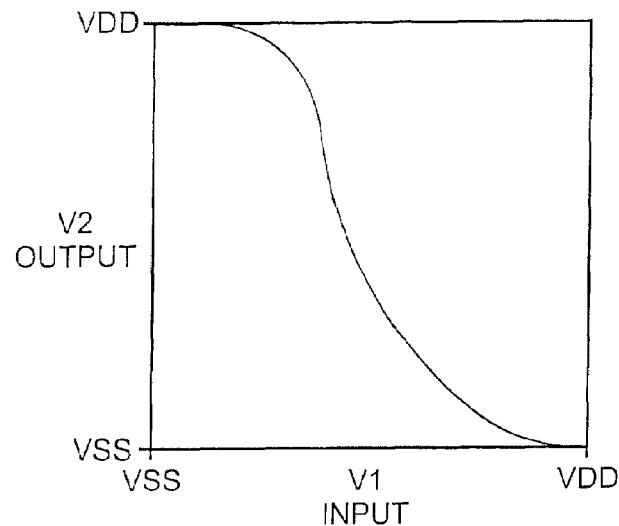
FIG. 3 is a graph showing an inverter transfer curve.

FIG. 3 shows a typical DC transfer curve between the inverter input voltage V1 and its output voltage V2. In the middle of the range, the inverter exhibits a large incremental voltage gain. Because of the voltage gain in the inverter stage, a logic signal sent through a series of inverters or logic gates will produce outputs more closely approaching VSS and VDD. It is important to note that at each end of the transfer curve, one of the MOS transistors is highly conducting and the other is off. The conducting MOS transistor has a non-zero resistance between its source and drain, so that voltages may be impressed on the inverter output if enough current is available.

Referring back to FIG. 1, the inverters I4 and I5 are connected in a loop so that positive feedback will occur. This causes their outputs to assume one of the two binary logic states, at either VSS2 or VDD2. A connection of this type creates a flip-flop, which is able to remember indefinitely one of two logic states. As noted above, the inverter outputs will provide a finite resistance connected to the supply voltages and are not firmly fixed in voltage level. Coupling capacitors C1 and C2 are connected to the two inverter outputs, so that fast current pulses coupled to the inverter outputs may be used to force a change in the state of the inherent flip-flop. Fast current pulses are generated by the inverter pair I1 and I3, with inverter I2 serving to reverse the logic state of one of the two outputs. The inverter group I1, I2, and I3 constitutes a logic signal buffer with a single input and a differential output providing both true and complementary outputs. In order for the signals to be transmitted to the receiving inverter pair I4 and I5 with maximum amplitude to give best performance, the inverters I4 and I5 are made using MOS transistors of minimum size. The capacitors C1 and C2 are chosen to have a value approximately 10 times the nodal capacitance of the cross coupled inverter pair I4 and I5. Capacitors fabricated in an integrated circuit typically have one side which has a parasitic capacitance to the circuit substrate. To minimize the undesired parasitic capacitance in the flip-flop, the coupling capacitors C1 and C2 are fabricated with their lower plates which have the excess substrate capacitance connected to the driving inverters I1 and I3. These capacitor plates are marked in FIG. 1 by a heavy marking.

When input signal transitions occur at VIN of FIG. 1, the inverters I1 and I3 change output state. Since these inverters are made to be substantially larger than the cross-coupled pair I4 and I5, their output current is able to overdrive the voltage present at the outputs of inverters I4 and I5. This transient current is coupled through the two capacitors C1 and C2 to control the logic state of I4 and I5. If the logic state is already in the condition which corresponds to the new input VIN, then the outputs of I4 and I5 will exhibit transient voltage spikes which cause their MOS transistor drains to conduct current to their body terminals, and therefore to the supplies VSS2 or VDD2. A change of state therefore does not occur. If the logic state is different and does not correspond to the new input VIN, then the MOS transistor drains are forced towards the opposite supply voltage as compared to their present state, and a change of state will occur. Positive feedback caused by the loop connection of the two inverters I4 and I5 acts to restore the inverter outputs to new logic values which are either VSS2 or VDD2. Therefore, it is only necessary to couple enough current through the capacitors C1 and C2 to cause the inverter outputs to move slightly more than halfway between the supplies VSS2 and VDD2. The positive regeneration will supply the impetus for a full logic swing output. In the course of the regeneration, the voltage and charge on the coupling capacitors C1 and C2 are restored to their initial values. An assumption is made here that the input logic transitions are sufficiently spaced to allow the circuit to attain a final value state with unchanging voltages between transitions. If the input signals are too fast, partial switching will occur in the circuit, and the logic output will ultimately fail to follow the input signals.

Note that the inverters I1, I2, and I3 are operated by one set of power supplies VDD1 and VSS1, and the inverters I4, I5, I6, and I7 are operated by another set of power supplies VDD2 and VSS2. A common mode voltage difference between these two groups of power supplies may be applied as the high voltage VPP. The capacitors C1 and C2 serve to block this high voltage, while transmitting fast signal transitions to the inverters I4 and I5.

Since the nodal capacitance in the flip-flop formed by I4 and I5 is critical to proper operation of the circuit, an additional buffer formed by inverters I6 and I7 is typically used as a signal buffer. The output of the buffer is a replica of the logic states at the input VIN. One inverter could be omitted to obtain an inverted output signal VOUT if desired. This buffer could of course be part of a more complex logic circuit such as a NAND gate, NOR gate, or other CMOS logic structure.

Although the circuits detailed here make use of CMOS construction, they may be easily translated to other logic families by one familiar with the state of the art. Use of CMOS circuitry is not required to obtain similar functionality.

Figure 4:
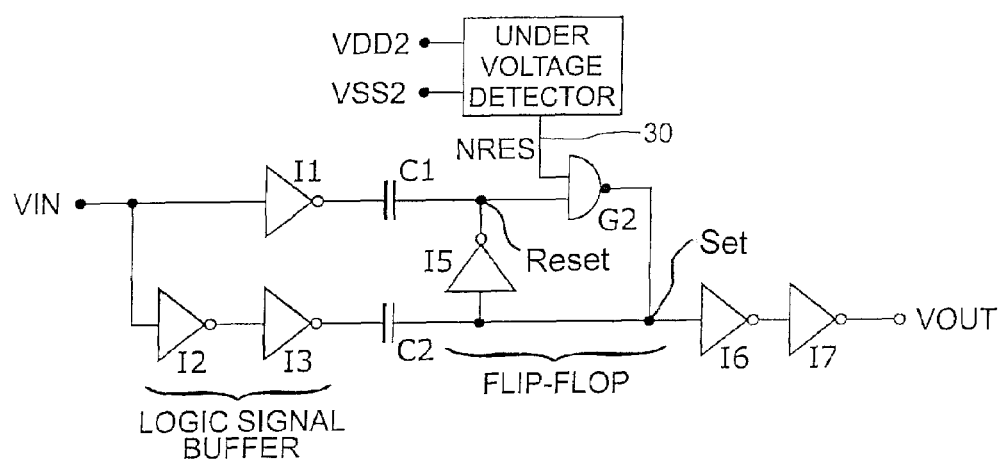
FIG. 4 is the circuit of the present invention with under voltage reset.

In a practical application, when power is first applied, the state of VOUT may not correspond to the state of VIN. This random startup state will depend on small asymmetries in the construction of the transistors, wiring, and components in the inverter circuit I4 and I5, together with noise influences. Therefore it is desirable to modify the circuit to permit startup in a known state. One method of doing this is shown in FIG. 4. In this circuit an additional means has been provided to permit resetting the state of the logic level translator to a known value. The inverter I4 of FIG. 1 has been replaced with a NAND logic gate G2. Logic gate G2 is made with CMOS logic as is known in the state of the art. The NAND gate has the property that if any of its inputs is low, then its output is high, and if all of its inputs are high, then its output is low. An auxiliary circuit monitors the value of the supply voltage (VDD2-VSS2) and generates an output signal NRES on wire 10. If the supply voltage is inadequate for proper circuit operation, as may occur on a transient basis when the circuit is first activated, the output signal NRES will go to a logic low level. This causes the flip-flop to assume a known state so that the level translator output signal VOUT will be at a logic low level. Alternatively, the inverter I5 could have been replaced by the NAND gate instead, so that the known state on VOUT would be a logic high level. Whenever power is applied to this circuit the level translator will assume the previously chosen known state.

Figure 5:
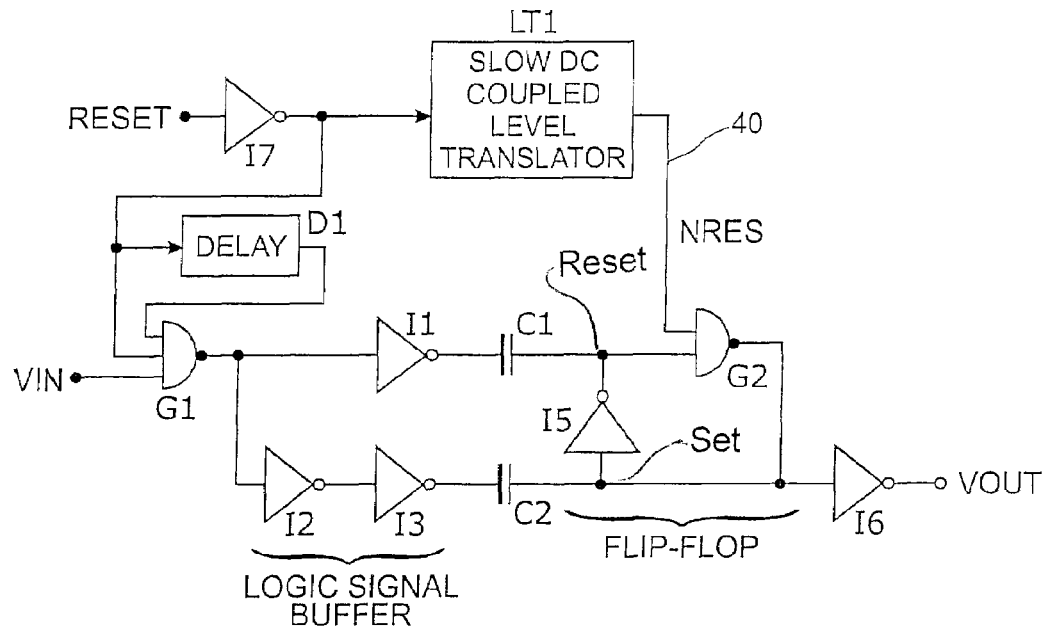
FIG. 5 is the circuit of the present invention with a reset circuit for setting the circuit to a known initial state.

FIG. 5 shows another method of controlling the startup state of the level translator by providing an external RESET input signal means. When the input RESET is taken high to an active state, it acts to block the transmission of changing inputs from VIN, and then sets the state of the flip-flop to a known value. The RESET input first goes through logic inverter I1 to create a logic low level, which is used to block signal transmission by using the NAND logic gate G1. The active low RESET signal is also sent through a DC coupled level translator to create a replica logic signal NRES on wire 11 which is at the signal levels needed by the floating logic circuitry. The DC coupled level translator may use a cross-coupled flip-flop transistor pair driven by differential currents as known in the state of the art. The signal NRES is then used to cause the output of NAND logic gate G2 to go high, setting the flip-flop formed by gate G2 and inverter I5 to a known state. This state corresponds to the state being output by NAND gate G1, so the portions of the circuit at the ground level and at the floating supply level have corresponding logic states.

A delay element D1 is used to delay a copy of the inverted RESET signal to go to an additional input of logic gate G1. The delay element is chosen so that its output changes will always occur after the output changes of the DC coupled level translator. In the cases when it cannot be guaranteed that the input signal VIN will be at a logic low level whenever the RESET input is active, the delay device causes the signals being transmitted through the capacitors C1 and C2 to correspond to the reset state. The output of the delay element is connected to an additional input of the logic gate G1 so that for a period of time after the RESET signal is turned off, the output of gate G1 will remain at a logic high state. This compensates for the time delay in the slow DC coupled level translator which is driving the floating circuitry. When the RESET input is low, all the associated inputs to gates G1 and G2 are at a logic high state, so that the signal changes at the input VIN may be transmitted to the output VOUT as previously detailed in the circuit of FIG. 1. Since an extra signal inversion is present in gate G1, the output buffer inverter I7 of FIG. 1 has been deleted. This causes VOUT to have the same logic polarity as the input signal VIN. In some special cases where the state of VIN is known, the delay element D1 and the third input to gate G1 may be omitted. As discussed previously, the RESET input signal may be derived completely or in part from an under voltage detector which monitors various power supply voltage conditions in the circuit.

Figure 6:
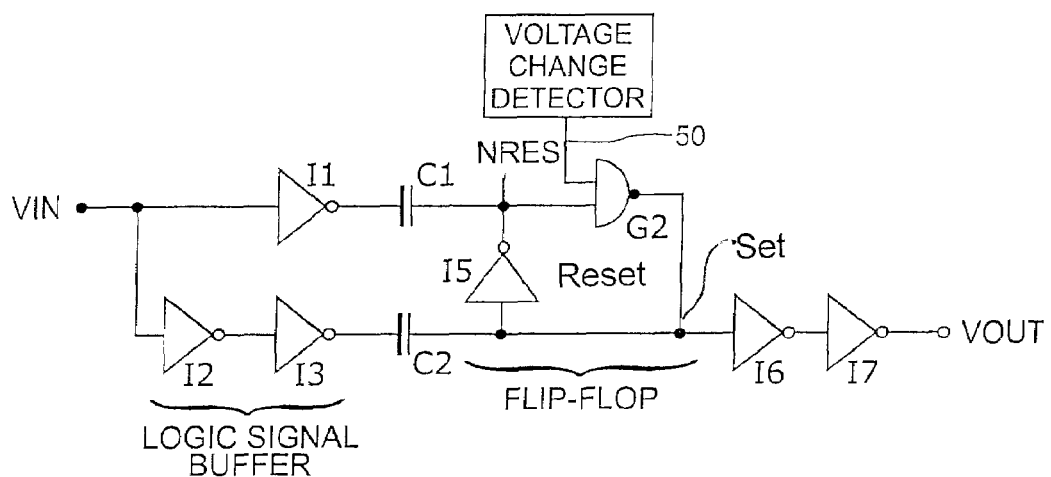
FIG. 6 is the circuit of the present invention with a supply voltage rate of change detector.

FIG. 6 shows another method of providing control of the output state of the logic voltage level translator. The under voltage detector of FIG. 4 is replaced with a voltage change detector. The voltage change detector determines if any or a chosen power supply voltage for the level translator circuit changes rapidly. Of particular concern is a rapid change in the value of VPP, which is the voltage normally impressed across the coupling capacitors C1 and C2. Rapid voltage changes will cause undesired displacement currents to flow in the terminals of the capacitors C1 and C2, and may cause the flip-flop formed by I4 and I5 to assume an undesired state. Use of a voltage change detector can determine if this condition is present, and reset the flip-flop to a desired known state so that circuit operation will be as desired. When the power supply voltage changes too quickly, the voltage change detector causes the signal NRES on wire 12 to go to a logic low state. This takes one input of gate G2 low, setting the flip-flop to a desirable known state. As a result, the level translator output voltage VOUT assumes a desired state.

Figure 7:
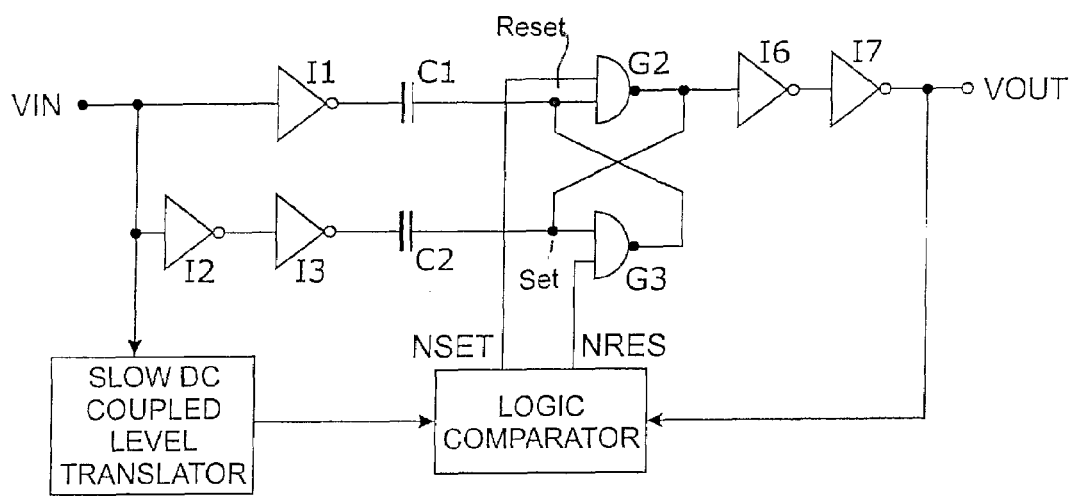
FIG. 7 is the circuit of the present invention with automatic correction.

FIG. 7 shows another method of providing control of the output state of the logic voltage level translator. The under voltage detector of FIG. 4 is replaced with a logic level comparator, which continuously compares the input VIN with the output VOUT using logic as known in the state of the art. If the two signals do not agree, then one of the signals NRES or NSET goes low and is sent to the flip-flop. Both inverters I4 and I5 of FIG. 1 are replaced with corresponding NAND gates G2 and G3 to provide auxiliary set and reset inputs for the flip-flop. If VOUT is low and VIN is high, a set command is sent to the flip-flop, and if VOUT is high and VIN is low, a reset command is sent to the flip-flop. A timer in the logic comparator allows for the delay in the slow DC coupled level translator which is used to provide information about the input signal VIN state to the logic level comparator. This timer uses principles well known in the state of the art to generate an output measured from the last signal disagreement time. If the signals disagree for less than a previously chosen time, then the set or reset signals are not generated. This prevents errors during transient changes in VIN. The circuit discussed here has the advantage of providing automatic correction of the logic level translator output state if noise or transient disturbances cause an error in the value of VOUT.

All of the techniques discussed in FIGS. 4 through 7 may be used in combination together with other methods not disclosed here by one familiar in the state of the art. No specific method is required to be used, and the choice of the combination depends on the application of the logic level translator.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A circuit for transmitting logic signals across a high voltage barrier comprising:
   a logic signal buffer with true and complement state differential outputs;
   a binary flip-flop with set and reset inputs;
   a first coupling capacitor coupled to the true buffer output and to the set input of the binary flip-flop;
   a second coupling capacitor coupled to the complement buffer output and to the reset input of the binary flip-flop circuit;
   a reset signal circuit coupled to the logic signal buffer for setting the circuit to a known initial state; and
   a logic gate for preventing a flow of input signal information during times a reset signal is active.

2. A circuit for transmitting logic signals across a high voltage barrier in accordance with claim 1 further comprising an output signal buffer coupled to the binary flip-flop.

3. A circuit for transmitting logic signals across a high voltage barrier in accordance with claim 1 wherein the logic signal buffer is constructed using CMOS technology.

4. A circuit for transmitting logic signals across a high voltage barrier in accordance with claim 1 wherein the binary flip-flop is constructed using CMOS technology.

5. A circuit for transmitting logic signals across a high voltage barrier in accordance with claim 1 wherein the first coupling capacitor and the second coupling capacitor each have a lower plate having an excess substrate capacitance coupled to the logic signal buffer to minimize parasitic capacitance.

6. A circuit for transmitting logic signals across a high voltage barrier in accordance with claim 1 further comprising a DC coupled level translator for coupling the reset signal circuit to the binary flip-flop circuit.

7. A circuit for transmitting logic signals across a high voltage barrier in accordance with claim 1 further comprising a delay circuit coupled to the reset signal circuit and to the logic gate.

8. A circuit for transmitting logic signals across a high voltage barrier comprising:
   a logic signal buffer with true and complement state differential outputs;
   a binary flip-flop with set and reset inputs,
   a first coupling capacitor coupled to the true buffer output and to the set input of the binary flip-flop;
   a second coupling capacitor coupled to the complement buffer output and to the reset input of the binary flip-flop circuit;
   a reset signal circuit coupled to the logic signal buffer for setting the circuit to a known initial state; and
   a power supply under voltage detection circuit to provide said reset signal.

9. A circuit for transmitting logic signals across a high voltage barrier comprising:
   a logic signal buffer with true and complement state differential outputs;
   a binary flip-flop with set and reset inputs;
   a first coupling capacitor coupled to the true buffer output and to the set input of the binary flip-flop;
   a second coupling capacitor coupled to the complement buffer output and to the reset input of the binary flip-flop circuit; and
   means for detecting a rate of change of at least one circuit power supplies, and providing a reset signal whenever a power supply voltage rate of change exceeds a chosen value.

10. A circuit for transmitting logic signals across a high voltage barrier comprising:
    a logic signal buffer with true and complement state differential outputs;
    a binary flip-flop with set and reset inputs;
    a first coupling capacitor coupled to the true buffer output and to the set input of the binary flip-flop;
    a second coupling capacitor coupled to the complement buffer output and to the reset input of the binary flip-flop circuit; and
    a logic comparison circuit having a first input coupled to the logic signal buffer and a second input coupled to the binary flip-flop output.

11. A circuit for transmitting logic signals across a high voltage barrier in accordance with claim 10 wherein an output of the logic comparison circuit is coupled to at least one of the set or reset inputs of the flip-flop.

12. A circuit for transmitting logic signals across a high voltage barrier in accordance with claim 8 further comprising an output signal buffer coupled to the binary flip-flop.

13. A circuit for transmitting logic signals across a high voltage barrier in accordance with claim 8 wherein the first coupling capacitor and the second coupling capacitor each have a lower plate having an excess substrate capacitance coupled to the logic signal buffer to minimize parasitic capacitance.

14. A circuit for transmitting logic signals across a high voltage barrier in accordance with claim 8 further comprising a DC coupled level translator for coupling the reset signal circuit to the binary flip-flop circuit.

15. A circuit for transmitting logic signals across a high voltage barrier in accordance with claim 8 further comprising a delay circuit coupled to the reset signal circuit and to the logic gate.

16. A circuit for transmitting logic signals across a high voltage barrier in accordance with claim 8 further comprising an output signal buffer coupled to the binary flip-flop.

17. A circuit for transmitting logic signals across a high voltage barrier in accordance with claim 9 wherein the first coupling capacitor and the second coupling capacitor each have a lower plate having an excess substrate capacitance coupled to the logic signal buffer to minimize parasitic capacitance.

18. A circuit for transmitting logic signals across a high voltage barrier in accordance with claim 9 further comprising a DC coupled level translator for coupling the reset signal circuit to the binary flip-flop circuit.

19. A circuit for transmitting logic signals across a high voltage barrier in accordance with claim 9 further comprising a delay circuit coupled to the reset signal circuit and to the logic gate.

* * * * *